United States Patent
Partyka

Patent Number: 5,838,180
Date of Patent: Nov. 17, 1998

[54] LOW-VOLTAGE FREQUENCY SYNTHESIZER

[75] Inventor: Andrzej Partyka, Bedminster, N.J.

[73] Assignee: Lucent Technologies Inc., Murray Hill, N.J.

[21] Appl. No.: 713,051

[22] Filed: Sep. 12, 1996

[51] Int. Cl.⁶ .............................. H03L 7/099; H03B 5/04
[52] U.S. Cl. .............................. 327/157; 327/105; 331/17
[58] Field of Search .................................. 327/105, 148, 327/157, 534, 535, 536, 147, 156, 116; 331/1 R, 17, 25, 34

[56] References Cited

U.S. PATENT DOCUMENTS

| | | | |
|---|---|---|---|
| 5,168,245 | 12/1992 | Koskowich | 331/17 |
| 5,315,270 | 5/1994 | Leonowich | 331/11 |
| 5,469,120 | 11/1995 | Nguyen et al. | 327/270 |

Primary Examiner—Timothy P. Callahan
Assistant Examiner—Eunja Shin
Attorney, Agent, or Firm—Steven R. Bartholomew

[57] ABSTRACT

An improved control voltage generator for use with a voltage-controlled oscillator (VCO), so as to enable VCO operation at low supply voltages of less than three volts. The control voltage generator includes a phase comparator, a charge pump, a switched voltage multiplier, and a control voltage filter. The output voltage of the phase detector is coupled to a sampling terminal of the charge pump, a power supply terminal of the charge pump is coupled to an output terminal of the switched voltage multiplier, and a voltage input terminal of the switched voltage multiplier is coupled to a first, reference signal. The charge pump, powered from the power supply terminal, generates a waveform including a plurality of pulses. Each of the plurality of pulses has a time duration substantially proportional to the voltage present at the sampling terminal. These pulses may be used as a VCO control voltage or, alternatively, a control voltage filter, coupled to the charge pump, may be used to transform the pulses into a VCO control voltage having desired characteristics.

5 Claims, 2 Drawing Sheets

LOW-VOLTAGE FREQUENCY SYNTHESIZER

BACKGROUND

1. Field of the Invention

The invention relates generally to radio receivers, and more specifically to radio receivers that are used for wireless telephone communications.

2. Description of Related Art

In portable radio receivers, such as those used in wireless telephone devices, power consumption, battery life, and weight are of primary concern. Oftentimes, the batteries represent the heaviest component of a receiver, and are a major factor in determining the total overall weight of the receiver. For enhanced portability and ease of use, it is desirable for portable receivers to be as lightweight as technology permits. Therefore, a multitude of prior art techniques have been directed at improving the efficiency of battery utilization, so as to permit the use of a lighter battery pack, and/or to minimize the number of cells required in the battery pack.

Nickel-Cadmium rechargeable batteries provide about 1.2 volts per cell, whereas Carbon-Zinc and lead-acid batteries provide about 1.5 volts per cell. Since many existing electronic circuits are unable to operate on such low voltages, present-day battery designs typically place a plurality of cells into a package, where the cells are wired in series to generate a specified voltage. For example, a conventional rectangular 9-Volt battery contains six 1.5-Volt cells wired in series. However, if circuitry could be designed to operate from relatively low voltages, this would permit the use of single-cell batteries in portable electronic equipment, thereby reducing weight and conserving space.

Some types of electronic circuits are readily adapted for operation at low voltages. By contrast, in other types of circuits, it is very difficult to reduce the operating voltage and maintain proper circuit performance at the same time. For example, a voltage-controlled oscillator (VCO) is a relatively critical circuit that does not perform well at reduced operating voltages. Therefore, existing circuit designs provide the VCO with a power supply of at least three volts. Reducing the VCO operating voltage to a value below three volts results in a severe performance degradation. Phase noise increases to an undesirably high level, and the range of frequencies to which the VCO may be tuned becomes impractically narrow for use in many real-world applications. Such a VCO would be wholly unsuitable for use in modem-day electronic equipment. Nevertheless, it would be desirable to provide a VCO that operates from a relatively low power supply voltage of less than three volts while exhibiting adequate performance in the areas of phase noise and tuning range.

SUMMARY OF THE INVENTION

An improved control voltage generator is disclosed for use with a voltage-controlled oscillator (VCO), so as to enable VCO operation at low supply voltages of less than three volts. The control voltage generator includes a phase comparator, a charge pump, a switched voltage multiplier, and a control voltage filter. The phase comparator compares the phase of a first, reference signal with the phase of a second, input signal, and generates an output voltage substantially proportional to the phase difference between the first and second signals. The switched voltage multiplier has a voltage input terminal, a switched terminal, and an output terminal. When a specified voltage, or a specified range of voltages, is present at the switched terminal, the switched voltage multiplies the voltage present at the voltage input terminal and applies the multiplied voltage to the output terminal. The charge pump includes a sampling terminal, a power supply terminal, and a charge pump output terminal. The output voltage of the phase detector is coupled to the sampling terminal of the charge pump, the power supply terminal of the charge pump is coupled to the output terminal of the switched voltage multiplier, and the voltage input terminal of the switched voltage multiplier is coupled to the first, reference signal. The charge pump, powered from the power supply terminal, generates a waveform including a plurality of pulses. Each of the plurality of pulses has a time duration substantially proportional to the voltage present at the sampling terminal. The charge pump places these pulses on the charge pump output terminal. These pulses may be used as a VCO control voltage or, alternatively, a control voltage filter, coupled to the charge pump output terminal, may be used to transform the pulses into a VCO control voltage having desired characteristics.

DETAILED DESCRIPTION OF THE PREFERRED EMBODIMENTS

Figure 1:
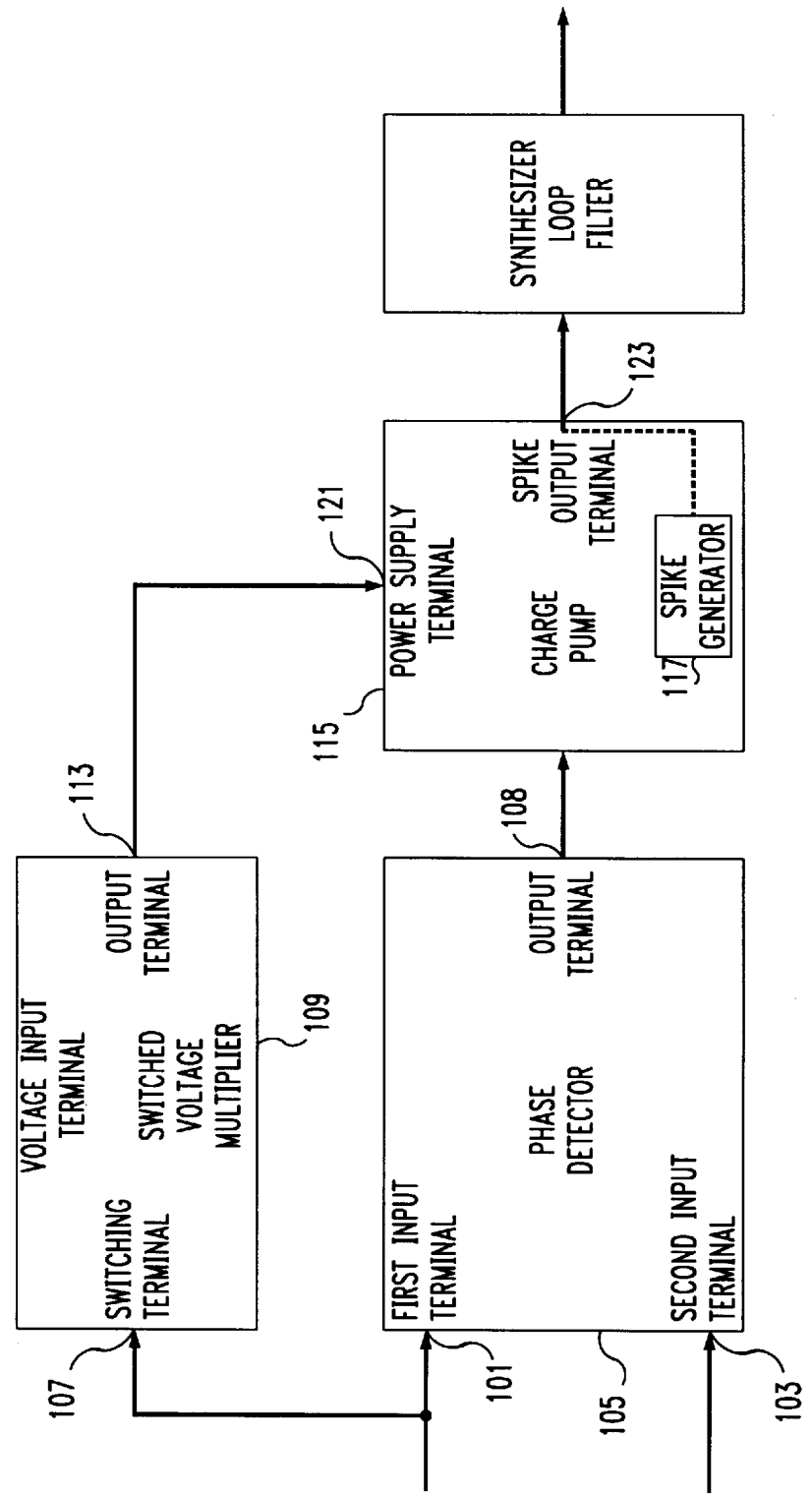
FIG. 1 is a hardware block diagram setting forth a first illustrative embodiment of the invention disclosed herein.

FIG. 1 is a hardware block diagram setting forth an embodiment of the invention disclosed herein. Although the hardware configuration of FIG. 1 may be conceptualized as representing a portion of a receiver in a wireless telephone, the techniques disclosed herein are applicable to virtually any type of radio receiver. For example, the present invention encompasses not only receivers that are used in wireless telephone devices, but also receivers used by law enforcement agencies, public safety organizations, businesses, aircraft pilots, maritime operators, and the public at large, including consumer products such as stereos, television sets, car radios, shortwave radios, AM/FM radios, or the like.

In portable receivers, battery utilization is enhanced by designing circuits that can operate at relatively low supply voltages. Although it is a relatively simple matter to design some types of circuits for operation at low voltages, the operation of voltage-controlled oscillators (VCO's) at low voltages poses problems. As the VCO tuning voltage is increased, the performance of the VCO also increases, especially in the areas of phase noise and the overall VCO tuning range. On the other hand, reducing the VCO tuning voltage to a value corresponding to that available from a single-cell battery supply results in inadequate VCO performance.

The control voltage generator disclosed herein generates a usable VCO tuning voltage from the relatively low voltage provided, for example, from a compact, lightweight battery supply. The control voltage generator is incorporated into, and/or used in conjunction with, the frequency synthesizer block of a radio receiver. By way of background, one function of this frequency synthesizer block is to compare a reference frequency with an input frequency, and to generate a VCO tuning voltage that is a function of the difference between the reference frequency and the input frequency.

As shown in FIG. 1, the control voltage generator 100 has a first input terminal 101 for receiving a first signal at a reference frequency, and a second input terminal 103 for receiving a second signal at an input frequency. A phase detector 105 compares the phase of the signal on the first input terminal 101 with the phase of the signal on the second input terminal 103 and generates an output voltage on output terminal 108 proportional to the phase difference between the first and second signals.

The first signal, at the reference frequency, is also coupled to a switching terminal 107 of a switched voltage multiplier 109. In addition to switching terminal 107, the switched voltage multiplier 109 also has a voltage input terminal 111 and an output port 113. When a specified voltage, or a specified range of voltages, is present at the switching terminal 107, the switching terminal 107 is said to be activated. Whenever the switching terminal 107 is activated, the switched voltage multiplier 109 multiplies the voltage present at the voltage input terminal 111 and applies the multiplied voltage to the output port 113. In the present example, the voltage input terminal 111 is connected to a battery 114 having a voltage less than or equal to three volts, and the switched voltage multiplier 109 operates as a voltage doubler, such that the voltage on the output port 113 is double the voltage at the voltage input terminal 111 when the switching terminal 107 is activated. For example, if the voltage on the input terminal 111 is 3.0 volts, the voltage on the output terminal is 6.0 volts when the switching terminal 107 is activated.

A charge pump 115 includes a current spike and/or pulse generator 117, a sampling terminal 119, a power supply port 121, and a spike and/or pulse output terminal 123. The spike and/or pulse generator 117, powered from the charge pump power supply port 121, generates current spike and/or pulse s, each spike and/or pulse having a time duration substantially proportional to the voltage present at the sampling terminal 119, and places these current spike and/or pulse s on the spike and/or pulse output terminal 123. A control voltage filter 125, coupled to the spike and/or pulse output terminal 123, transforms current spike and/or pulse s into a VCO control voltage 127 having desired characteristics. VCO control voltage 127 is used to control VCO 128.

The output voltage on output terminal 108 of phase detector 105 is coupled to the sampling terminal 119 of the charge pump, the power supply port 121 of the charge pump is coupled to the output port 113 of the switched voltage multiplier, and the voltage input terminal 111 of the switched voltage multiplier is coupled to the first, reference signal.

Figure 2:
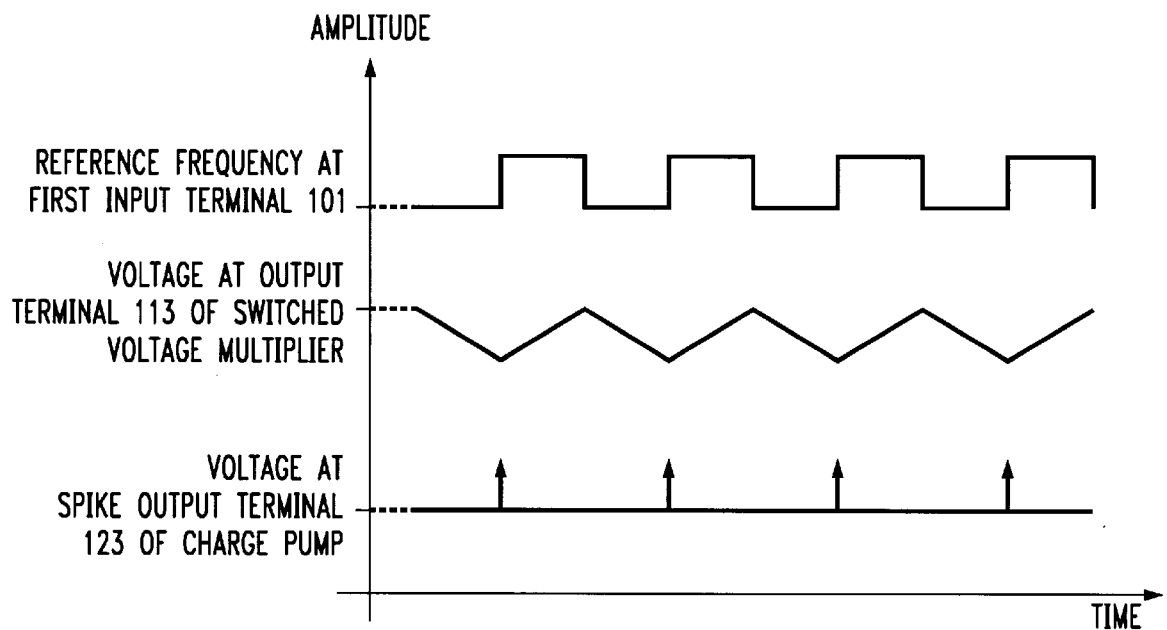
FIG. 2 is a waveform diagram showing illustrative voltage waveforms for the hardware diagram of FIG. 1.

FIG. 2 shows illustrative voltage waveforms at several locations in the circuit configuration of FIG. 1. In the example of FIG. 2, the reference frequency applied to first input terminal 101 (FIG. 1) is a square waveform 201. This square waveform 201 is also applied to the switching terminal 107 of the switched voltage multiplier 109 (FIG. 1). In response to the receipt of square waveform 201 (FIG. 2) at switching terminal 107 (FIG. 1), the switched voltage multiplier 109 generates a triangular waveform 202 (FIG. 2) at output port 113 (FIG. 1). This triangular waveform 202 has the same period as square waveform 201, and is in a phase relationship with square waveform 201 such that the triangular waveform 202 reaches a peak positive amplitude at every positive-going edge of square waveform 201. Triangular waveform 202 reaches a peak negative amplitude at every negative-going edge of square waveform 201.

Pulsed waveform 203 represents the signal at the spike and/or pulse output terminal 123 of charge pump 115 (FIG. 1). In response to the receipt of triangular waveform 202 (FIG. 2) at power supply port 121 , the charge pump 115 (FIG. 1) generates a train of voltage spike and/or pulse s. The charge pump generates a voltage spike and/or pulse at every negative peak of triangular waveform 202.

Figure 3:
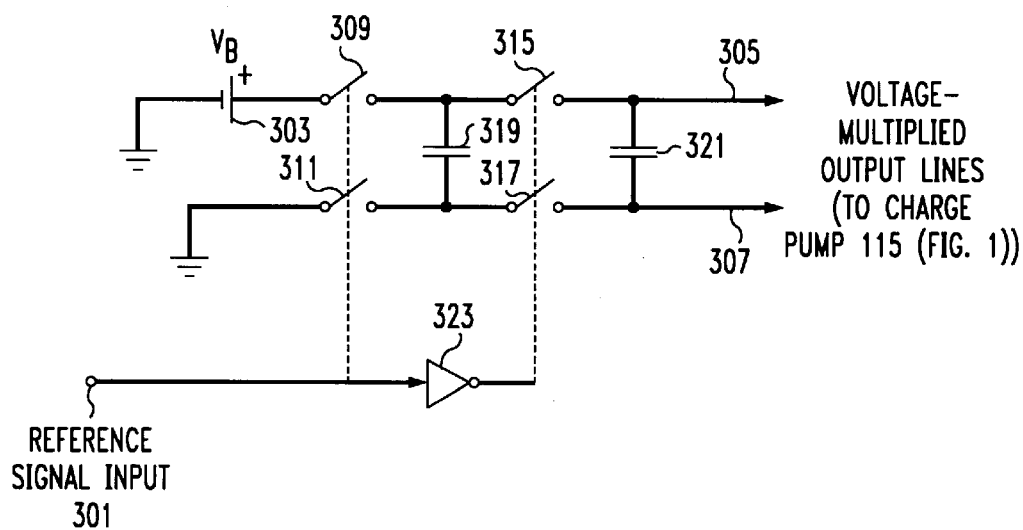
FIG. 3 is a hardware block diagram setting forth a second illustrative embodiment of the invention disclosed herein.

FIG. 3 is a hardware block diagram showing an illustrative implementation for the switched voltage multiplier 109 of FIG. 1. A battery 114 having a voltage of $V_B$ is connected to voltage input terminal 111 (FIGS. 1 and 3). A first switch contact of a first single-pole, single-throw (SPST) switch 309 is connected to battery 114, and a first switch contact of a second single-pole, single-throw (SPST) switch 311 is connected to ground. The second switch contact of switch 309 is connected to a first terminal of a first capacitor 319, and the second switch contact of switch 311 is connected to a second terminal of first capacitor 319. The state (open or closed) of switches 309 and 311 is controlled by a voltage on switching terminal 107. In the present example, switches 309 and 311 are switched in tandem, whereby both switches are in the same state, such that both switches are open, or both switches are closed.

Although FIG. 3 shows the use of a first SPST switch for switch 309 and a second SPST switch for switch 311, this is for purposes of illustration, as one double-pole, single-throw switch could be employed to replace first switch 309 and second switch 311. Moreover, although mechanical switches are shown, this is done for purposes of conceptualization. In practice, solid-state circuit elements well-known to those skilled in the art, such as transistor switches, could be employed to implement switches 309 and 311.

First terminal of first capacitor 319 is connected to a first switch contact of a third switch 315, and second terminal of first capacitor 319 is connected to a first switch contact of a fourth switch 317. The second switch contact of the third switch 315 is connected to a first terminal of a second capacitor 321, and the second switch contact of the fourth switch 317 is connected to a second terminal of second capacitor 321. The states of the third and fourth switches 315, 317 are controlled by the output of a voltage inverter 323, which inverts the voltage present at switching terminal 107. The output of voltage inverter 323 controls third and fourth switches 315, 317 in tandem, such that both switches are in the same state, either open or closed. By using inverter 323, the operation of first and second switches 309 and 311 is synchronized with the operation of third and fourth switches 315, 317. In this manner when first and second switches 309, 311 are closed, third and fourth switches 315, 317 are open, and when third and fourth switches 315, 317 are closed, first and second switches 309, 311 are open.

As in the case of first and second switches 309, 311, solid-state devices may be used to implement third and fourth switches 315, 317. The first terminal of second capacitor 321 is connected to a first output rail 305, and the second terminal of second capacitor 321 is connected to a second output rail 307. Taken together, first and second output rails 305, 307 may be conceptualized as representing output port 113 (FIGS. 1 and 3).

In operation, when a first voltage is applied to switching terminal 107, switches 309 and 311 are both placed into a closed state, and battery 114 charges first capacitor 319 to voltage $V_B$. The voltage at switching terminal 107, inverted in polarity by inverter 323, is applied to switches 315 and 317, opening these switches. When a second voltage is applied to switching terminal 107, switches 309 and 311 are both placed into an open state, whereas switches 315 and 315 are both placed into a closed state. First capacitor 319 is now connected in parallel with second capacitor 321, and any charge that is present on first capacitor 319 will cause current to flow from first capacitor 319 to second capacitor 321, thereby charging second capacitor 321. The output port 113 of the switched voltage multiplier 109 (FIGS. 1 and 3) is essentially connected across second capacitor 321.

If the voltage applied to switching terminal 107 is a periodic square wave that includes a first voltage in a first portion of the waveform and a second voltage in a second portion of the waveform, the first portion of the waveform will close switches 309 and 311, charging first capacitor 319, while switches 315 and 317 are open. At this time, the voltage across second capacitor 321 and, hence, across output rails 305 and 307 is gradually falling, as any charge on the second capacitor 321 is dissipated. The second portion of the waveform will open switches 309 and 311, while closing switches 315 and 317, using first capacitor 319 to charge second capacitor 321. At this time, the voltage across second capacitor 321 gradually increases until second capacitor 321 is fully charged. Thus, the voltage across output rails 305 and 307 is the triangular waveform 202 depicted in FIG. 2 when the voltage applied to switching terminal 107 is the square waveform 201 shown in FIG. 2.

We claim:

1. A control voltage generator including:
   (a) a phase comparator for measuring the phase difference between a reference waveform and an input waveform and for generating a voltage proportional to the phase difference on a phase comparator output terminal;
   (b) a charge pump having a charge pump input terminal, a power supply port, and a charge pump output terminal, the charge pump input terminal being coupled to the phase comparator output terminal, wherein, in response to signals received at the charge pump input terminal, the charge pump uses power applied to the power supply port to generate a VCO control voltage at the charge pump output terminal;
   (c) a switched voltage multiplier having a first input coupled to the reference waveform, a second input coupled to a DC power source, and an output port coupled to the power supply port of the charge pump, wherein, in response to signals received at the first input, the switched voltage multiplier uses the DC power source at the second input to generate a multiplied voltage at the output port.

2. The control voltage generator of claim 1 further including a control voltage filter having a filter input port and a filter output port, wherein the filter input port is coupled to the charge pump output terminal, and the filter output port represents a filtered VCO control voltage for controlling a VCO.

3. A method of generating a control voltage for controlling a VCO including the following steps:
   (a) comparing the phase of a first, reference signal with the phase of a second, input signal;
   (b) generating an output voltage substantially proportional to the phase difference between the first and second signals;
   (c) using a voltage source to multiply the voltage of the first signal so as to generate a voltage-multiplied signal; and
   (d) in response to the output voltage, using the voltage-multiplied signal to generate a VCO control voltage.

4. The method of claim 3 wherein the VCO control voltage includes a plurality of current pulses each having a time duration substantially proportional to the output voltage.

5. The method of claim 4 wherein the VCO control voltage is filtered by a synthesizer loop filter to transform the current pulses into a filtered VCO control voltage.

* * * * *